(12) United States Patent
Wiemer et al.

(10) Patent No.: US 8,204,720 B2
(45) Date of Patent: Jun. 19, 2012

(54) GRAPH-BASED MODELING APPARATUS AND TECHNIQUES

(75) Inventors: Douglas Wiemer, Ashton (CA); Mohammed Riyas Valiyapalathingal, Ottawa (CA); Louie Kwan, Nepean (CA); Jennifer Li, Kanata (CA); Stanley TaiHai Chow, Ottawa (CA)

(73) Assignee: Alcatel Lucent, Paris (FR)

( * ) Notice: Subject to any disclaimer, the term of this patent is extended or adjusted under 35 U.S.C. 154(b) by 798 days.

(21) Appl. No.: 11/756,970

(22) Filed: Jun. 1, 2007

(65) Prior Publication Data

US 2008/0300834 A1 Dec. 4, 2008

(51) Int. Cl.
G06F 17/50 (2006.01)
G06F 7/60 (2006.01)
G06F 17/10 (2006.01)
G06F 17/00 (2006.01)
G06F 7/00 (2006.01)
G09G 5/00 (2006.01)

(52) U.S. Cl. ............... 703/2; 703/1; 707/624; 707/637; 707/665; 345/619

(58) Field of Classification Search ............... 703/1, 2; 707/1; 345/619; 3/1
See application file for complete search history.

(56) References Cited

U.S. PATENT DOCUMENTS

| | | | | |
|---|---|---|---|---|
| 5,272,704 A * | 12/1993 | Tong et al. | ...... | 714/26 |
| 6,184,897 B1 * | 2/2001 | Gueziec et al. | ...... | 345/440 |
| 6,336,138 B1 * | 1/2002 | Caswell et al. | ...... | 709/223 |
| 6,741,242 B1 * | 5/2004 | Itoh et al. | ...... | 345/419 |
| 7,720,779 B1 * | 5/2010 | Perry et al. | ...... | 706/45 |
| 2005/0172306 A1 * | 8/2005 | Agarwal et al. | ...... | 719/328 |
| 2006/0200494 A1 * | 9/2006 | Sparks | ...... | 707/104.1 |
| 2007/0067845 A1 * | 3/2007 | Wiemer et al. | ...... | 726/25 |
| 2007/0266039 A1 * | 11/2007 | Boykin et al. | ...... | 707/102 |

OTHER PUBLICATIONS

Murali Kodialam, T. V. Lakshman, "Detecting Network Intrusions via Sampling: A Game Theoretic Approach", IEEE INFOCOM 2003.*
David M. Nicol, William H. Sanders and Kishor S. Trivedi, "Model Based evaluation: From Dependability to security", IEEE, 2004.*
F. Baiardi, S. Suin, c. Telmon, and M. Pioli, "Assessing the Risk of an Information Infrastruture Through Security Dependencies", 2006.*
David M. Nicol, "Model Based Evaluation: From Dependability to Security", IEEE 2004.*
M. Kodialam and T. V. Lakshman, "Detecting Network Intrusions via Sampling : A Game Theoretic Approach", IEEE, IEEE INFOCOM 2003, San Francisco, CA, USA, Mar. 30-Apr. 3, 2003.

* cited by examiner

*Primary Examiner* — David Silver
*Assistant Examiner* — Angel Calle
(74) *Attorney, Agent, or Firm* — Eckert Seamans Cherin & Mellott LLC (57) ABSTRACT

Graph-based modeling apparatus and techniques are disclosed. Based on a model including model nodes that represent components of a modeled system, operational dependencies between model nodes, and model edges that interconnect the nodes and represent relationships between the components in the modeled system, subset computations are performed to compute subsets of the model nodes that can impact operational dependencies between other model nodes. When the model changes, a determination is made as to whether an incremental subset computation should be performed for one or more particular operational dependencies between model nodes in the changed model, and if so, an incremental subset computation is performed. Otherwise, a full subset computation or no subset computation might be performed. In this manner, model changes are considered on a case-by-case basis to determine an extent, if any, to which subsets should be re-computed.

15 Claims, 5 Drawing Sheets

| Index | Relationship | Subset(s) | |
|---|---|---|---|
| 1 | Server 1 Depends-On Database 1 | {A, C}, {B, C} | ← 62 |
| 2 | Server 2 Depends-On Database 2 | {C, D}, {C, E} | ← 64 |

| Model Node | Index to Relationship(s) | |
|---|---|---|
| A | 1 | ← 72 |
| B | 1 | ← 74 |
| C | 1, 2 | ← 76 |
| D | 2 | ← 78 |
| E | 2 | ← 80 |

GRAPH-BASED MODELING APPARATUS AND TECHNIQUES

FIELD OF THE INVENTION

This invention relates generally to electronic modeling and, in particular, to managing updates to graph-based electronic models.

BACKGROUND

Graph-based electronic modeling is used, for example, in the field of system reliability analysis. Many methods currently exist for calculating system risk in the form of likelihood of failure. Within this field, there are specific references to the use of "cut-sets" to enable fast enumeration of Binary Decision Diagrams (BDDs) for Probabilistic Risk Assessment (PRA).

In the field of communication network security analysis, there are cases where cut-sets have been used as a method for identifying critical points in a network graph where network attacks or intrusions could be detected. One such approach is described in Kodialam and Lakshman, "Detecting Network Intrusions via Sampling: A Game Theoretic Approach", IEEE, IEEE INFOCOM 2003, San Francisco, Calif., USA, Mar. 30-Apr. 3, 2003. In that paper, cut-sets are used to identify key points in a network for flow monitoring between a source endpoint and a destination endpoint.

Currently known applications of cut-sets tend to focus on algorithms for initial enumeration or computation of the cut-sets. No mechanisms are provided for handling re-enumeration of cut-sets due to changes in the topology of an underlying graph.

Thus, one potential problem with known graph-based modeling techniques lies in the re-enumeration of cut-sets, between source and destination endpoints for instance, following a change in a graph-based model. It appears as though currently known techniques involve completely re-enumerating all cut-sets in the event of any topology change in an underlying graph. This is very inefficient, and can be particularly problematic for cut-set applications to analysis in a real-time or near real-time situations, as would be the case for network flow monitoring, for example. As the complexity of a graph and the number of interactions or operational dependencies between graph nodes increase, the processing time and resources required to completely re-enumerate all cut-sets can render cut-set techniques infeasible in at least some applications.

In the context of network security analysis, or network analysis in general, actual network topology changes, and accordingly model changes, can be quite common. Complete re-enumeration of all cut-sets could severely limit the usability of a system based on cut-sets. Re-enumeration issues may similarly affect the use of cut-sets in other scenarios where the topology of a graph changes over time. For example, in the case of system reliability analysis, any change in an underlying system would affect the BDD and a re-enumeration of the cut-sets would be required, according to currently known techniques, in order to perform PRA.

Thus, there remains a need for improved graph-based modeling apparatus and techniques.

SUMMARY OF THE INVENTION

Some embodiments of the present invention address limitations in cut-set techniques by optimizing the handling of topology changes on a case-by-case basis, and assessing changes for their effect on the connectivity of a graph between source and destination endpoints. The case-by-case analysis may systematically determine that, responsive to a change in the topology of a model, known cut-sets should not be re-enumerated, an incremental or partial re-enumeration should be performed to re-enumerate some of the known cut-sets or to initially enumerate new cut-sets, or a complete re-enumeration should be performed to re-enumerate all cut-sets for a graph that incorporates the change.

According to one aspect of the present invention, an apparatus comprises a computation module and a control module operatively coupled to the computation module. The computation module is operable to perform subset computations, based on a model comprising model nodes that represent components of a modeled system, operational dependencies between model nodes, and model edges that interconnect the nodes and represent relationships between the components in the modeled system, so as to compute subsets of the model nodes that can impact operational dependencies between other model nodes, and the control module is operable to determine whether, due to a change to the model, an incremental subset computation should be performed for one or more particular operational dependencies between model nodes in the changed model, and to cause the computation module to perform an incremental subset computation where it is determined that an incremental subset computation should be performed.

The control module may be further operable to determine whether no subset computation or a full subset computation should be performed for all operational dependencies between model nodes in the changed model due to the change to the model, and to cause the computation module to perform a full subset computation where it is determined that full subset computation should be performed or an incremental subset computation where it is determined that an incremental subset computation should be performed. No subset computation is performed where it is determined that no subset computation should be performed.

In some embodiments, the control module is operable to determine whether an incremental subset computation should be performed by identifying a model node that is affected by the change, and determining whether the affected model node comprises a subset of model nodes that can impact an operational dependency between other model nodes.

The incremental subset computation may include at least one of: a subset computation for a new operational dependency between model nodes, and a subset computation for an existing operational dependency between model nodes.

The apparatus may also include a change detector operatively coupled to the control module and operable to detect the change to the model and to provide to the control module an indication of detection of the change.

A user interface may also be operatively coupled to the control module and operable to receive inputs from a user, in which case the change comprises a change entered by a user through the user interface.

The change to the model may, but need not necessarily, reflect a change in the modeled system.

The control module may be operable to determine whether a full, an incremental, or no subset computation should be performed by at least one of: determining that no subset computation is to be performed where the change comprises adding to or deleting from the model a leaf model node having no operational dependencies with other model nodes, determining that a full subset computation is to be performed where the change comprises adding to the model a model node that is not a leaf model node, determining that an incremental subset computation is to be performed where the change comprises deleting from the model a model node that is not a leaf model node, determining that an incremental subset computation is to be performed where the change comprises adding to or deleting from the model an operational dependency between model nodes, determining that a full subset computation is to be performed where the change comprises adding to the model a model edge between model nodes, and determining that an incremental subset computation is to be performed where the change comprises deleting from the model a model edge between model nodes.

The apparatus may also include an analysis system operatively coupled to the subset computation module and to the control module and operable to perform an analysis of a parameter associated with the modeled system based on the computed subsets. In this case, the control module may be further operable to determine whether a full analysis of the modeled system, an incremental analysis for one or more particular operational dependencies between model nodes in the changed model, or no analysis of the modeled system should be performed due to the change, and to cause the analysis system to perform a full analysis where it is determined that a full analysis should be performed or an incremental analysis where it is determined that an incremental analysis should be performed. No analysis of the modeled system is performed where it is determined that no analysis of the modeled system should be performed.

The analysis system may comprise a security risk analysis system operable to perform a security risk analysis based on the computed subsets.

In some embodiments, each of the subsets comprises a minimal cut-set.

Another aspect of the invention relates to a method that includes performing subset computations, based on a model comprising model nodes that represent components of a modeled system, operational dependencies between model nodes, and model edges that interconnect the nodes and represent relationships between the components in the modeled system, so as to compute subsets of the model nodes that can impact operational dependencies between other model nodes, determining whether, due to a change to the model, an incremental subset computation should be performed for one or more particular operational dependencies between model nodes in the changed model, and performing an incremental subset computation where it is determined that an incremental subset computation should be performed.

The method may also include determining whether no subset computation or a full subset computation should be performed for all operational dependencies between model nodes in the changed model due to the change to the model, and performing a full subset computation where it is determined that a full subset computation should be performed. No subset computation is performed where it is determined that no subset computation should be performed.

The operation of determining may involve identifying a model node that is affected by the change, and determining whether the affected model node comprises a subset of model nodes that can impact an operational dependency between other model nodes.

In some embodiments, the incremental subset computation comprises at least one of: a subset computation for a new operational dependency between model nodes, and a subset computation for an existing operational dependency between model nodes.

Determining whether an incremental subset computation should be performed may involve determining that an incremental subset computation is to be performed where the change comprises deleting from the model a model node that is not a leaf model node, adding to or deleting from the model an operational dependency between model nodes, or deleting from the model a model edge between model nodes. Determining whether no subset computation or a full subset computation should be performed may involve determining that a full subset computation is to be performed where the change comprises adding to the model a model node that is not a leaf model node or adding to the model a model edge between model nodes, and determining that no subset computation is to be performed where the change comprises adding to or deleting from the model a leaf model node having no operational dependencies with other model nodes.

The method may also include performing an analysis of a parameter associated with the modeled system based on the computed subsets, determining whether a full analysis of the modeled system, an incremental analysis for one or more particular operational dependencies between model nodes in the changed model, or no analysis of the modeled system should be performed due to the change, and performing a full analysis where it is determined that a full analysis should be performed or an incremental analysis where it is determined that an incremental analysis should be performed. No analysis of the modeled system is performed where it is determined that no analysis of the modeled system should be performed.

Each of the subsets comprises a minimal cut-set in some embodiments.

Such a method may be implemented, for example, in instructions stored on a computer-readable medium.

Another aspect of the invention provides a computer-readable medium storing a data structure. The data structure includes a plurality of model node fields comprising information indicative of respective model nodes that represent components of a modeled system, the model nodes comprising a model that further comprises operational dependencies between the model nodes, and model edges, which interconnect the model nodes and represent relationships between the components in the modeled system, and a plurality of operational dependency fields respectively associated with the model node fields, the operational dependency field associated with a model node field for a model node comprising information indicative of an operational dependency between other model nodes for which the model node comprises a subset of model nodes that can impact the operational dependency. The operational dependency fields enable a determination to be made as to whether, due to a change to the model that affects one or more of the model nodes, an incremental subset computation should be performed to compute subsets of model nodes that can impact one or more particular operational dependencies of the respective operational dependencies.

Other aspects and features of embodiments of the present invention will become apparent to those ordinarily skilled in the art upon review of the following description.

BRIEF DESCRIPTION OF THE DRAWINGS

Examples of embodiments of the invention will now be described in greater detail with reference to the accompanying drawings.

DETAILED DESCRIPTION OF PREFERRED EMBODIMENTS

The present application refers to the documents below and to the technologies disclosed therein:

U.S. patent application Ser. No. 11/232,004, entitled "APPLICATION OF CUT-SETS TO NETWORK INTERDEPENDENCY SECURITY RISK ASSESSMENT", and filed on Sep. 22, 2005;

U.S. patent application Ser. No. 11/131,598, entitled "SECURITY RISK ANALYSIS SYSTEMS AND METHODS", and filed on May 18, 2005;

U.S. patent application Ser. No. 11/132,118, entitled "COMMUNICATION NETWORK SECURITY RISK EXPOSURE MANAGEMENT SYSTEMS AND METHODS", and filed on May 18, 2005;

U.S. patent application Ser. No. 11/366,101, entitled "INFORMATION SYSTEM SERVICE-LEVEL SECURITY RISK ANALYSIS", and filed on Mar. 2, 2006;

U.S. patent application Ser. No. 11/366,100, entitled "SYSTEMS AND METHODS OF ASSOCIATING SECURITY VULNERABILITIES AND ASSETS", and filed on Mar. 2, 2006.

The entire contents of the above-referenced documents are incorporated herein by reference.

Figure 1:
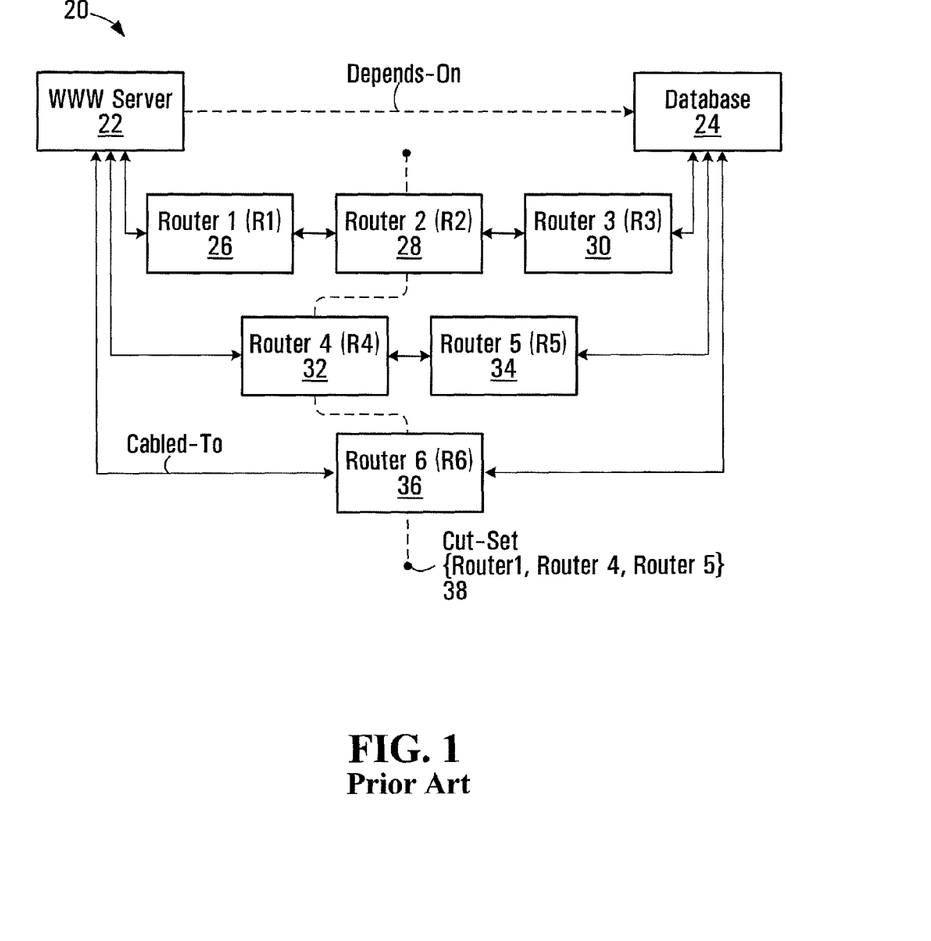
FIG. 1 is a block diagram illustrating an example of a model, highlighting the presence of a cut-set.

A physical system such as a communication system may be modeled in terms of assets or components that are deployed in the system, the relationships between components, and operational dependencies between components. FIG. 1 is a block diagram showing types of components, relationships, and operational dependencies in an example of a model. It should be appreciated that the present invention is in no way limited to the particular types of components, relationships, and operational dependencies shown in FIG. 1. Embodiments of the invention may be applied to other systems having different topologies, components, relationships, and/or operational dependencies. In general, systems having fewer, further, and/or different components, relationships, and operational dependencies may be modeled and analysed according to the techniques disclosed herein. FIG. 1, as well as the other drawings, are thus intended solely for illustrative purposes, and do not limit the scope of the present invention.

FIG. 1 is a block diagram illustrating another example of a model. In the model 20, a server model node 22 has a "Depends-on" operational dependency with a database model node 24, representing a dependency of a server on a database in a modeled system. Interactions between the server and the database modeled at 22, 24 are enabled through a network of interconnected routers represented by the model nodes 26, 28, 30, 32, 34, 36. The server model node 22, the database model node 24, and the router model nodes 26, 28, 30, 32, 34, 36 are interconnected as shown through "Cabled-to" relationships.

In the example model 20, the nodes 26, 28, 30, 32, 34, 36 represent physical components, namely routers. Logical components in the form of operating systems, an Internet (WWW) server, and a database are represented by the model nodes 22, 24.

The model 20 includes "Cabled-to" relationships, which relate to modeled paths through which two system components can directly interact with each other. Operational dependencies relate to a reliance of one modeled component on another. A "Depends-on" operational dependency of the server corresponding to the model node 22 on the database corresponding to the model node 24 is also shown in FIG. 1. As will be apparent from FIG. 1, this operational dependency involves relationships and other modeled components to the extent that interactions between the server and the database are indirect, through the "Cabled-to" relationships and the routers represented in the model 20.

The server corresponding to the model node 22 and the router corresponding to the model node 26 have a "Cabled-to" relationship, indicating that the modeled server and router 1 communicate through some sort of connection, such as a wired connection, a wireless connection, or possibly a connection that includes segments of different connection types.

Another type of interaction between the server and the database modeled at 22, 24 is represented by the "Depends-on" operational dependency. The server may provide an inventory system which accesses inventory information stored in the database, for example. The server, or a function it supports, is thereby dependent upon the database, and thus the model 20 includes a "Depends-on" operational dependency between the server model node 22 and the database model node 24.

Although shown in FIG. 1 as direct relationships, the actual connections between components in a modeled system need not necessarily be direct in a physical sense. A connection that is modeled as a single model edge in a system model might not be a direct physical connection in a modeled system, depending on the detail or "granularity" of the model. The connection represented by the "Cabled-to" relationship between the server model node 22 and the router 1 model node 26 might include external modems or other communication devices at the server and router 1, for example, which are not separately modeled in the example shown. Such a connection may, however, be modeled to a different level of "granularity" by separately modeling the modems and a physical connection between the modems, for instance, in other embodiments.

During construction of a system model, once a relationship or operational dependency has been defined, related or dependent components are linked to each relationship or operational dependency of which they are a part. Any of various techniques may be used to link components to relationships and/or operational dependencies. Relationships and operational dependencies could be created in a model database, for example, with a data structure for each relationship or operational dependency including data entries indicating a type of the relationship or operational dependency and the endpoint components that are members of the operational dependency.

As discussed in further detail below, relationships and operational dependencies are handled differently in embodiments of the invention when a system is modeled using a graph-based model. Where a graph-based model is used in further analysis of a modeled system, for a security assessment or for analysis based on parameters other than security parameters for instance, relationships and operational dependencies and possibly their types may affect how parameters propagate between components.

Figure 2:
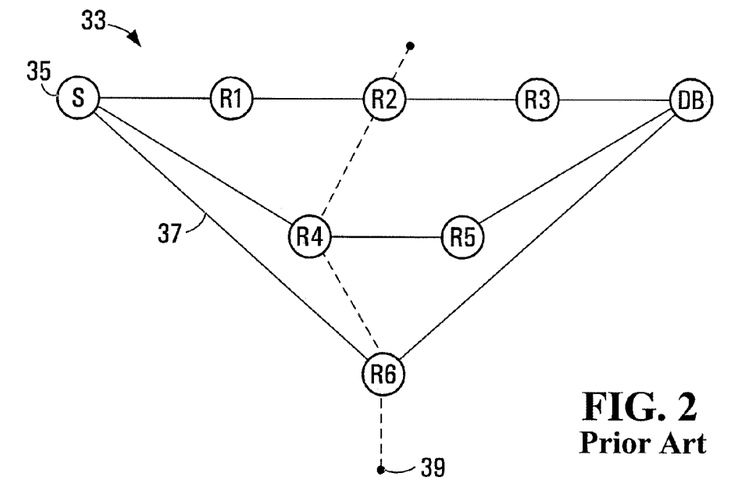
FIG. 2 is a block diagram of a simplified view of the graph-based model shown in FIG. 1.

Another view of a graph-based model is shown in FIG. 2. The model 33 illustrates that components of a modeled system are represented in a graph-based model by model nodes 35 and relationships between components are represented by model edges 37. As shown, the model 33 includes model nodes 35 for the server (model node S), the database (model node DB), and for the routers (model nodes R1, R2, R3, R4, R5, R6), as well as model edges 37 representing relationships, which are "Cabled-to" relationships in this example, between model nodes. The "Depends-on" operational dependency between the server and the database has not been explicitly shown in FIG. 2, but may be configured by a user during model construction or at a later time when interactions between the server and the database are to be analysed.

According to embodiments of the invention, cut-sets are used to enumerate critical aspects of the path between dependent model nodes. For a communication network model for instance, cut-sets may be used to identify model nodes that are critical to traffic flow between the dependent nodes. In a system reliability case, cut-sets can be used to identify critical items under analysis whose failure would sever a BDD used to perform PRA. For the purposes of demonstrating embodiments of the invention, communication network models will be used as an illustrative example, although it should be appreciated that the invention could also apply to other cases where cut-sets are used.

An electrical power system is another example of a type of system to which the techniques proposed herein could be applied, for reliability and/or security analysis for instance. Control systems, highway systems, railway systems, water systems, sewer systems, and various other types of systems can also be considered collections of interconnected components with dependencies between components, and can be modeled and analysed using the techniques disclosed herein. References to relationships and operational dependencies should be interpreted accordingly, to include relationships and operational dependencies that might be used to model systems of any of these types. A relationship in an electrical power system model might be provided through an electromagnetic coupling or a conductor, whereas a relationship between intersections in a highway system might be provided through a road, for example. In terms of operational dependencies, a product distribution hub in a railway system might depend on other stations from which distributed products are received.

It should also be appreciated that models may relate to actual deployed systems, or systems that are under design but not yet actually deployed. Thus, a modeled system need not necessarily be an existing physical system.

A cut-set refers to a set of model nodes that, if removed from a graph-based model, disconnects (or cuts) the model graph into two distinct sub-graphs. The Minimal Cut-Set (MCS) problem is to find a cut-set of a minimum size; in other words, no sub-set of an MCS is still a cut-set. In a networking system model, a cut-set is a minimal set of model nodes selected in such a manner that removing the nodes of the cut-set, and their adjacent model edges, leaves two model nodes that represent dependent components, such as the server model node 22 and the database model node 24 in FIG. 1, in two different sub-networks (i.e., there is no path between the dependent model nodes, or the components, in the remaining sub-networks).

Given that removal of the model nodes of a cut-set results in two different sub-graphs, with no relationship remaining between dependent model nodes, it results that model nodes in each identified cut-set may impact an operational dependency between other model nodes in a certain way. A cut-set may affect the security state of traffic between two dependent communication system components, for example, and thereby the security state of the dependent components themselves. Therefore, the model nodes of a cut-set may impact operational dependencies between other model nodes, and changes to a system model that affect any of the model nodes in a cut-set for a particular operational dependency may also impact that operational dependency.

FIGS. 1 and 2 illustrate the cut-set concept by way of an example cut-set 38, 39. The server (model node 22/S) and the database (model node 24/DB) are physically linked via multiple relationships through the routers (model nodes 26/R1, 28/R2, 30/R3, 32/R4, 34/R5, 36/R6). In the models 20, 33, it is expected to find 6 different cut-sets, as follows, one of which is shown in FIGS. 1 and 2:

Router 1, Router 4, Router 6;
Router 1, Router 5, router 6;
Router 2, Router 4, Router 6 (i.e., the cut-set 38, 39);
Router 2, Router 5, router 6;
Router 3, Router 4, Router 6; and
Router 3, Router 5, router 6.

In the network analysis context, removing all of the model nodes of a cut-set will inevitably disconnect the server (model node 22/S) from the database (model node 24/DB). From a security standpoint, any compromise across the members of the cut-set will guarantee a security compromise in the flow of information between the server (model node 22/S) and the database (model node 24/DB). Other uses for cut-sets may be or become apparent to those familiar with system modeling and/or analysis.

The above-referenced U.S. patent application Ser. No. 11/232,004 provides a detailed description of the use of cut-sets for network path enumeration and identification of critical nodes, whose compromise could result in the security compromise of traffic between nodes. Since the present invention relates primarily optimizing the re-enumeration of cut-sets following topology changes, the general concept of cut-sets is described specifically herein only to the extent necessary to convey an understanding of embodiments of the invention.

According to embodiments of the invention, techniques are used to optimize the enumeration or re-enumeration of cut-sets for operational dependencies between model nodes. Enumeration of cut-sets is also referred to herein as computation of subsets. Thus, in the present disclosure, a cut-set may be considered an example of a subset, and enumeration is an example of a subset computation.

One optimization technique that is used in embodiments of the invention is to provide a persistent view of all cut-sets, specifically MCSs in some embodiments, between all dependent model nodes. As discussed in further detail below, indexing and persisting of MCSs may be used to provide such a persistent view of cut-sets.

Dependent model nodes may represent source and destination points of a network path, for example (i.e., they may have a "Depends-on" relationship). A persistent view of cut-sets may be provided by storing, for all dependent nodes in a system model, corresponding intervening cut-sets in new data structures within a model database for instance, and for each model node "x" in the model, maintaining a lookup table for tracking the operational dependencies having cut-sets in which the model node "x" appears.

Figure 3:
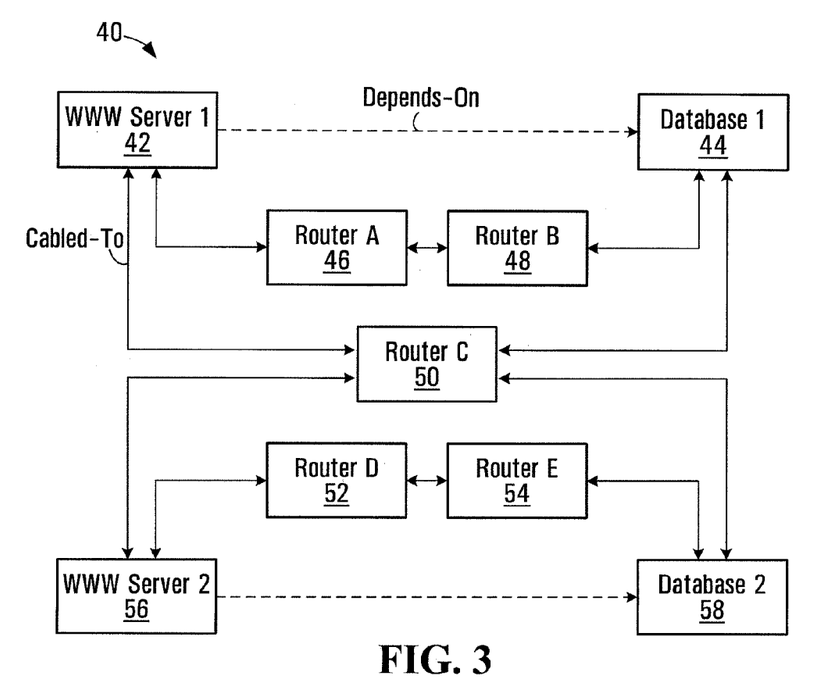
FIG. 3 is a block diagram of a further example of a model.

This approach will be further discussed below with reference to FIGS. 3 to 5. FIG. 3 is a block diagram of a further example of a model, FIG. 4 is a block diagram of a table of operational dependencies between model nodes and subsets of other model nodes that can impact each operational dependency, and FIG. 5 is a block diagram of a table of model nodes and operational dependencies that each model node can impact.

Referring first to FIG. 3, the model 40 includes model nodes 42, 56 representing two servers 1 and 2, model nodes 44, 58 representing two databases 1 and 2 with which the servers 1 and 2 have respective "Depends-on" operational dependencies, and model nodes 46, 48, 50, 52, 54 representing routers through which the servers 1 and 2 and the databases 1 and 2 interact. The model 40 also includes model edges representing "Cabled-to" relationships as shown.

Figure 4:
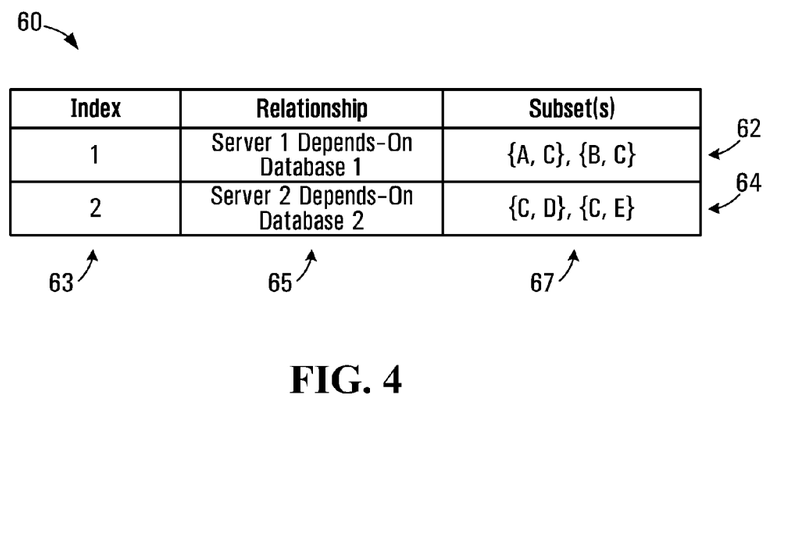
FIG. 4 is a block diagram of a table of operational dependencies between model nodes and subsets of other model nodes that can impact each operational dependency.
Figure 5:
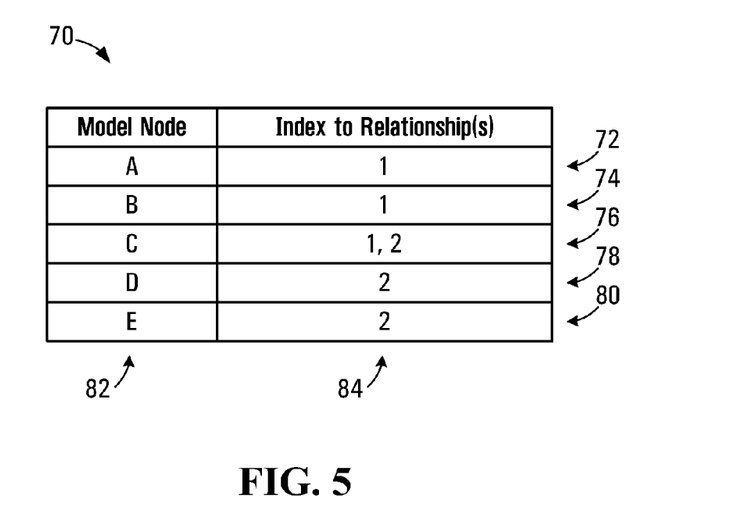
FIG. 5 is a block diagram of a table of model nodes and operational dependencies that each model node can impact.

The table 60 shown in FIG. 4 might be stored on a computer-readable medium to provide a mapping between operational dependencies and model node subsets for each operational dependency. Each record 62, 64 in the table 60 includes an index data field storing an index of an operational dependency, a data field 65 storing information indicative of the operational dependency itself, and a subset data field 67 storing information that is indicative of subsets of model nodes that may impact the operational dependency.

The index data field 63 provides an index that is used in some embodiments to map model nodes to operational dependencies, as will become apparent from FIG. 5 and the description thereof below. Information in the operational dependency data fields 65 and the subset data fields 67 may be generated as described in the above-referenced patent applications, for example. Operational dependencies may be manually configured or automatically generated based on a network map for instance, and the subsets in the data fields 67 are cut-sets, and specifically MCSs, in some embodiments.

In terms of the actual content of the data fields 63, 65, 67, embodiments of the present invention may define operational dependencies and subsets in any of various ways. Operational dependencies may be indexed at 63 using a sequence of numbers as shown, and defined at 65 using endpoint component or model node identifiers. Subsets may similarly be defined using component or model node identifiers. Other embodiments may define operational dependencies and/or subsets in different ways.

As will be apparent from a review of FIGS. 3 and 4, the table 60 includes a record 62, 64 for each of the "Depends-on" operational dependencies between the servers 1 and 2 and the databases 1 and 2 of the model 40. The subsets {A, C}, {B, C} can impact operational dependency 1 between the server 1 and the database 1, and the subsets {C, D}, {C, E} can impact operational dependency 2 between the server 2 and the database 2.

With reference now to FIG. 5, the table 70 provides a mapping between model nodes and the operational dependencies for which they appear in a subset. In the table 70, this mapping is between model nodes and operational dependency indices. As shown, the table 70 includes per-node records 72, 74, 76, 78, 80 that in combination include model node fields 82, which store information, such as node identifiers, that is indicative of respective model nodes, and operational dependency fields 84, which are respectively associated with the model node fields and store information indicative of an operational dependency for which the model node appears in a subset. The operational dependency fields 84, in the form of indices in the example shown, enable a determination to be made as to whether, due to a change to the model that affects one or more of the model nodes, an incremental subset computation should be performed to compute subsets of model nodes that can impact only one or more particular operational dependencies. This is described in further detail below.

The tables 60, 70 are illustrative of data structures that may be stored on one or more computer-readable media or otherwise used in embodiments of the invention. Other embodiments may use data structures that include fewer, further, and/or different data fields that are organized in a similar or different order. For example, the index data fields 63 in the table 60 allow operational dependencies to be indexed in the table 70 without storing a complete definition of each operational dependency, but might not be used in all embodiments. Operational dependencies that may be affected by a change to a model could be identified by searching the subset data fields 67 in the table 60 rather than providing a separate mapping table such as 70, for instance. Further variations may be or become apparent to those skilled in the art.

Figure 6:
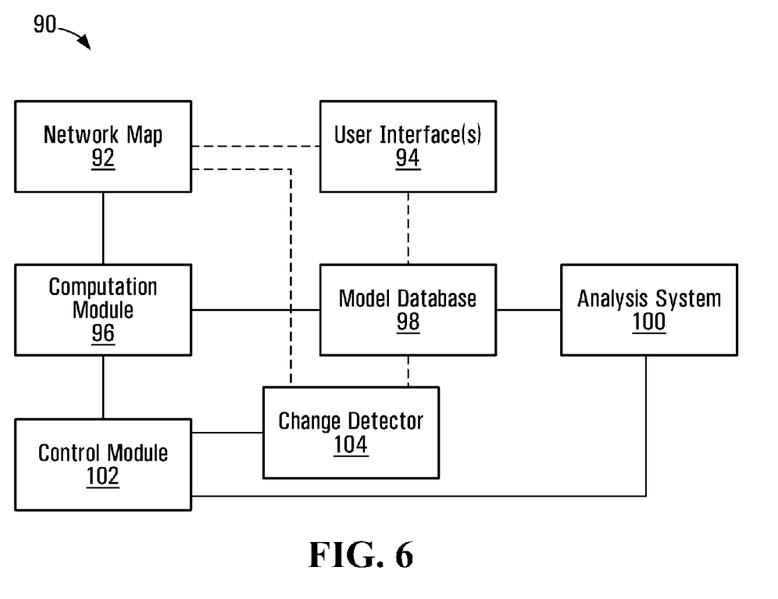
FIG. 6 is a block diagram of an apparatus according to an embodiment of the invention.

FIG. 6 is a block diagram of an apparatus according to an embodiment of the invention. The apparatus 90 includes a memory storing a system map 92, one or more user interface(s) 94 that may be operatively coupled to the system map and/or to a memory storing a model database 98, a computation module 96 operatively coupled to the system map, to the model database, and to a control module 102, a change detector 104 that is operatively coupled to the control module and to the system map and/or the model database, and an analysis system 100 operatively coupled to the model database and to the control module.

A device or system in or in conjunction with which the apparatus 90 is implemented may include other elements in addition to those shown in FIG. 6. It should be appreciated that only elements that are involved in system modeling have been explicitly shown in the apparatus 90. It should also be appreciated that not all of the elements shown in FIG. 6 need necessarily be provided in every embodiment of the invention. Thus, the apparatus 90 is representative of one illustrative embodiment of the invention. Other embodiments may be implemented using further, fewer, or different components than shown in FIG. 6, with similar or different interconnections.

The types of connections through which the elements of FIG. 6 are operatively coupled may, to at least some extent, be implementation-dependent. Communication equipment components often use various types of physical connectors and wired relationships such as midplane and backplane conductors, although the present invention is in no way limited to wired connections. In the case of cooperating software functions, for example, an operative coupling may be through variables or registers, and thus be an indirect coupling rather than a direct physical coupling. Elements may also be otherwise indirectly physically coupled to each other. For example, the user interface(s) element 94 is indirectly coupled to the control module 102, through the change detector 104 and the system map 92 and/or the model database 98 in the example shown. These indirectly coupled components can still be considered to be operatively coupled together in the sense that the control module 102 may take certain actions depending on information entered by a user through a user interface 94, as described below.

The user interface(s) element 94 represents one or more user interfaces, and possibly interfaces of multiple different types, that enable a user to manually enter inputs into the apparatus 90. A user might enter information through a user interface 94 in order to make changes to the system map 92 as components are added to or removed from a modeled system and configure relationships and dependencies in the model database 98, for example. User interface devices such as a keyboard and a pointing device might be provided at 94. Some user interface devices might provide both input and output functions, as in the case of a touchscreen. Physical interface devices may be used to support logical user interfaces such as a Graphical User Interface (GUI) or a Command Line Interface (CLI).

Although only a single user interface(s) element 94 is shown in FIG. 6, multiple user interfaces may be provided. For example, system management and control might be enabled through a GUI or CLI, whereas a different GUI or CLI could be used for modeling purposes. In this case, different types of user interfaces are provided for different purposes. In general, the number and types of user interfaces, and also their relationship(s) to other elements, may vary depending on the device or system in conjunction with which the apparatus 90 is implemented. Those skilled in the art will be familiar with many such user interfaces and their operation.

One or more memory devices may be used to store the system map 92 and the model database 98. Solid state memory devices are common in electronic systems, although other types of memory devices, including devices for use with movable or even removable storage media, may also or instead be used. The system map 92 and the model database 94 are shown in FIG. 6 as examples of information that might be stored and used in system modeling. Other information could also be stored in the same memory device(s) as the system map 92 and/or the model database 98.

The system map 92 stores component and topology information for a modeled system. In the case of a communication network, the system map 92 might be a network map that is used for network management and/or control functions. The model database 98 may be stored separately, as shown, where management/control and modeling functions are not integrated into the same system. As noted above, the techniques disclosed herein may be applied to systems that have been deployed or to systems that are under design. For a system that is being designed but has not yet been deployed, a system map 92 might not exist and the model database stores a model of a planned system.

As described in further detail below, the computation module 96 and the control module 102 optimize subset computations for graph-based models. Changes in a model stored in the model database 98 are detected by the change detector 104 and analysed to determine whether a full or incremental computation of subsets is in order. This is in contrast with conventional graph-based modeling techniques, in which subsets for an entire model would be re-computed for any change in the model.

At least the computation module 96, the control module 102, the analysis system 100, and the change detector 104 may be implemented using hardware, firmware, software for execution by one or more processing elements, or some combination thereof. Any or all of devices such as microprocessors, microcontrollers, Programmable Logic Devices (PLDs), Field Programmable Gate Arrays (FPGAs), Application Specific Integrated Circuits (ASICs), Network Processors (NPs), and other types of "intelligent" integrated circuits may be suitable for this purpose.

Given the many possible options for implementing the elements 96, 100, 102, 104, these elements are described herein primarily in terms of their functions. Based on the functional descriptions, a person skilled in the art will be enabled to implement techniques according to embodiments of the invention in any of various ways.

The computation module 96 is operable to perform subset computations based on a model of a modeled system. The model is stored in the model database 98, and might be generated automatically by the computation module 96 or another element based on the system map 92. The model could instead be built manually. Model building schemes in which model nodes and model edges are determined from the system map 92 by the computation module 96 and operational dependencies of interest are entered manually through a user interface 94, for example, are also contemplated.

During an initial subset computation, subsets of model nodes that can impact operational dependencies between other model nodes are computed by the computation module 96 for all operational dependencies. When a change is made to the model, the control module 102 determines whether an incremental subset computation should be performed for one or more particular operational dependencies between model nodes in the changed model, and if so, causes the computation module 96 to perform an incremental subset computation. The control module 102 may send an instruction or a command to the computation module 96, for example. In some embodiments, the tables 60, 70 shown in FIGS. 4 and 5 are stored with the model database 98 or possibly separately, and the control module 102 makes this determination by identifying a model node, and possibly each model node, that is affected by the change, and then accessing the tables to identify the operational dependency or dependencies that the affected model node(s) can impact.

The control module 102 thus enables subset computations to be selective or incremental. If a change to a model affects only model nodes that can impact only certain operational dependencies, then subset re-computations can be limited only to operational dependencies having at least one subset that includes an affected model node.

In some cases, depending on the nature of a change to the model, the control module 102 may determine that a full subset computation should be performed for all operational dependencies in the changed model. The control module 102 might also determine that no subset computation is necessary. Examples of full, incremental, and no subset computation scenarios are provided below.

Following a change in a model, the changed model may include different model nodes, model edges, and/or different operational dependencies. A subset computation that is performed after a change has been made to a model may therefore include an initial subset computation for new operational dependencies or a re-computation for one or more operational dependencies that existed between model nodes before the change was made.

Changes to a model may arise in any of various ways. New components and/or relationships could be added to a modeled system, for example, in which case the model of that system should also be updated. The apparatus 90 might receive updates to the system map 92 from a management or control system database periodically or when changes are made. Updated information could in this case be compared with previous information by the change detector 104 in order to detect system changes. System changes might also or instead be flagged in an updated system map to enable changes to be detected by the change detector 104 based on flags. Event notifications may instead be used to explicitly notify the change detector 104 as system changes occur. System changes may be automatically propagated into the model database 98 by the change detector 104, the computation module 96, or possibly another element.

In some embodiments, the change detector 104 provides an asset and asset relationship reconciling function. Unique identifiers such as Media Access Control (MAC) addresses, Internet Protocol (IP) addresses, and/or interfaces within a customer domain may be used in modeling assets and asset relationships. Such identifiers may then also be used to reconcile assets and their relationships, specifically "Cabled-to" relationships in the examples described in detail herein.

In some embodiments, changes may be made in the model database 98 manually, to determine the effects of changes before such changes are actually made in a modeled system. This type of function would be useful, for example, during a design process. Such changes, which might be made through a user interface 94 for instance, are stored in the model database 98 temporarily in some embodiments. Direct changes in the model database 98 could be detected by the change detector 104 in a similar manner as system changes, through comparisons, flags, and/or notifications for instance.

The present invention is in no way restricted to any specific change detection mechanism. In general, changes are detected by the change detector 104, which provides indications of detected changes to the control module 102. Change indications may take any of various forms, such as a notification including details of a detected change, an change event alert, etc.

Model changes that change the topology of a model may be assessed on a case-by-case basis. Examples of events that could cause topology changes in a system, illustratively a communication network, include at least the following, and possibly others:

Case #1: Addition/deletion of a component or model node that is a leaf component or node;

Case #2: Addition/deletion of a component or model node that is a non-leaf component or node;

Case #3: Addition/deletion of a new set of dependent components or model nodes (e.g., a "Depends-on" relationship);

Case #4: Addition/deletion of a relationship between components or model nodes (e.g., a "Cabled-to" relationship).

These changes may be analysed as described below with the intent to determine which changes affect operational dependencies and which do not, thereby limiting unnecessary subset computation processing. It should be apparent that the addition or deletion of a component from a modeled system will at some point be reflected in a model of that system, after the deleted component has been detected and the corresponding model node has been removed from the model either automatically or manually. Relationship changes are similarly ultimately reflected in corresponding changes in model edges of a model. As noted above, changes may be made to a model to test hypothetical or design scenarios. References to model nodes and model edges being added or deleted should be interpreted accordingly, to include addition/deletion of model nodes or model edges due to changes in a modeled system or only in the model itself.

Considering first Case #1, addition/deletion of a model node that is a leaf node would not affect any existing "Depends-on" operational dependencies since a leaf node would not be part of a subset for any existing operational dependencies and therefore, existing subsets need not be re-enumerated. If a new "Depends-on" operational dependency is created involving the newly added node, however, then the process outlined below for Case #3 applies.

Referring to FIG. 3, for example, adding a standalone host to Router D would not affect either of the "Depends-on" operational dependencies in the model 40, and hence no subsets are affected. If this host enters into a "Depends-on" operational dependency with any other modeled component, however, then subsets for that new operational dependency could be computed as described below.

In Case #2, addition/deletion of a model node that is not a leaf node changes the topology of a model. This is a scenario that can affect existing subsets and thus existing operational dependencies. Hence, at least some computation of subsets will be in order. However, the extent of subset computation may be different for addition and deletion as described below.

Upon addition of a model node that affects the topology of a model, there might be no way to predict which "Depends-on" operational dependencies will have subsets that are affected by the change without re-computing subsets for the entire model. Therefore, complete re-computation of subsets for all existing "Depends-on" operational dependencies is performed. Where the tables 60, 70 in FIGS. 4 and 5 are provided, both tables are updated accordingly.

For example, referring again to FIG. 3, adding a new Router F connecting Routers A, C, and D will change the topology of the modeled system and thus the topology of the model 40. A complete re-computation of subsets for both "Depends-on" operational dependencies is performed. In embodiments where tables 1 and 2 are implemented, both tables are cleared and new entries are added.

If a non-leaf model node is deleted, the only "Depends-on" operational dependencies that the deleted model node can affect are those that have at least one subset including that model node. Therefore, although deleting a non-leaf model node can affect the topology of a system, it only affects those "Depends-on" operational dependencies whose subsets the model node is a part of. Hence, only the subsets for those operational dependencies are re-computed.

To determine the subsets that need to be re-computed, the model node could be used as a look-up in the table 70 (FIG. 5) to identify the operational dependency index to the table 60 (FIG. 4), which is in turn used to reference the operational dependencies for which subsets should be re-computed. No other operational dependencies are affected. In re-computing the subsets for the affected operational dependencies, the entries in the table 60 can be updated for each affected operational dependency, and the table 70 can be similarly updated to identify all model nodes that can impact each operational dependency.

In deleting Router B from the system modeled by the model 40 of FIG. 3, for example, the table 70 indicates that the only operational dependency, and thus the only subsets, affected are those associated with index 1 in the table 60. Referring to index 1 of the table 60, only the "Depends-on" operational dependency between the server 1 and the database 1 should be re-computed. No other operational dependencies are affected. Following this incremental re-computation of subsets for the affected operational dependency, the only remaining subset for this operational dependency is the subset {C} in an MCS scenario. Index 1 of the table 60 is updated accordingly, and in the table 70, the index to the table 60 for model node entries A and B are deleted.

Considering Case #3, addition/deletion of an operational dependency affects the operational dependencies in a model, and appropriate changes are made to the tables 60, 70, as described below.

In the case of an addition, no re-computation of existing subsets is required. However, an initial subset computation for the new operational dependency is to be performed and appropriate entries are added to the tables 60, 70, if those tables are provided. For example, adding a new "Depends-on" operational dependency between server 1 and server 2 (FIG. 3) does not alter any existing operational dependencies. A new record for "Server 1 Depends-on Server 2" is inserted into the table 60 with index 3 and subset {C}, and the record for model node C in the table 70 will be updated to reflect the fact that model node C is now a part of the "Server 1 Depends-on Server 2" operational dependency.

For an operational dependency deletion, the reverse is performed. The corresponding record for that operational dependency is deleted from the table 60, and changes are also made to the table 70 to delete the corresponding index for the deleted operational dependency from the node records.

Case #4, the addition/deletion of a model edge between model nodes in the graph (e.g., a "Cabled-to" relationship), is another scenario where the topology of a model is affected. Some level of subset computation will generally be performed. The extent of subset computation may be different for addition and deletion, as described below.

Where a model edge is added between model nodes in a model, and both of the end nodes are non-leaf nodes after adding this edge, there might be no way to predict which "Depends-on" operational dependencies will have subsets that are affected by the change. Therefore, a full subset computation for all "Depends-on" operational dependencies in the model is performed. The tables 60, 70 are cleared, the table 60 is updated to identify all subsets for each operational dependency, and the table 70 is updated to identify all model nodes with their associated membership indices from the table 60.

Adding model edges (e.g., "Cabled-to" relationships) between the Router C and the Routers A and D will affect the topology of the model 40 (FIG. 3). Therefore, a full subset computation is performed to compute subsets for both of the "Depends-on" operational dependencies. The tables 60, 70 are cleared and new entries are added as appropriate.

Upon deleting a model edge between model nodes (e.g., removing a "Cabled-to" relationship), the only affected operational dependencies are those that involve that model edge. That is, deletion of a model edge can be treated in the same manner as the model nodes at either end of the model edge being deleted. Therefore, although deleting a model edge will affect the topology of the network, it will only affect the operational dependencies having at least one subset that has, as a member, at least one of the model nodes at either end of the deleted model edge. Incremental subset computations for only those operational dependencies are performed. In some embodiments, the model nodes involved in the deleted model edge are first referenced in the table 70 to determine the index in the table 60 that identifies the operational dependency(ies) affected. In re-computing the subsets for the affected operational dependencies, the subset data fields 67 in the table 60 are updated for the affected index. Similarly, the table 70 is updated to identify all model nodes that are now a part of the operational dependency.

If the "Cabled-to" relationship between the Routers A and B in the model 40 is deleted, for example, then the records 72, 74 for each of the model nodes A and B is referenced in the table 70. Since both of these model node records refer to index 1 to the table 60, only the subsets between server 1 and server 2 are to be re-computed. Following this incremental subset computation, the only subset for this operational dependency is {C}. Index 1 of the table 60 is updated accordingly, and in the table 70, the index to the table 60 for model node entries A and B are deleted.

Therefore, from the foregoing, it will be apparent that the control module 102 may determine whether a full or an incremental subset computation should be performed by:
  determining that no subset computation is to be performed where a change relates to adding to or deleting from the model a leaf model node having no operational dependencies with other model nodes;
  determining that a full subset computation is to be performed where the change relates to adding to the model a model node that is not a leaf model node;
  determining that an incremental subset computation is to be performed where the change relates to deleting from the model a model node that is not a leaf model node;
  determining that an incremental subset computation is to be performed where the change relates to adding to or deleting from the model an operational dependency between model nodes;
  determining that a full subset computation is to be performed where the change relates to adding to the model a model edge between model nodes; or
  determining that an incremental subset computation is to be performed where the change relates to deleting from the model a model edge between model nodes.

Any one or more of these determinations may be made by the control module 102 in analysing a change to a model.

In some embodiments, the control module 102 also controls other operations in addition to model node subset computation. The analysis system 100 of the apparatus 90 is operable to perform an analysis of a parameter associated with a modeled system based on the subsets computed by the computation module 96. In the apparatus 90, the computation module 96 stores subset information with the model database 98, and the analysis system 100 accesses that subset information. Other arrangements may also or instead be implemented to provide the analysis system 100 with subset information.

The analysis system 100 may be or include a security risk analysis system for performing a security risk analysis based on the computed subsets. A system for security risk analysis based on subsets in the form of cut-sets is described in the above-referenced U.S. patent application Ser. No. 11/232,004, for example. Other applications of subsets may also or instead be provided by the analysis system 100.

The control module 102 may be further operable to determine whether a full analysis of the modeled system or an incremental analysis for one or more particular operational dependencies between model nodes in a changed model should be performed in the event of a change, and to cause the analysis module 100 to perform either a full analysis or an incremental analysis in accordance with the determination.

Considering the illustrative example of network security analysis by the analysis system 100, at least the following topology changes specific to network vulnerability assessment may be of interest:
  Case #5: Addition/deletion of a vulnerability to any component in a modeled network;
  Case #6: Addition/deletion of a service asset as a component in a modeled network.

Vulnerabilities and service assets are described in detail in the above-referenced patent applications.

These changes may also be analyzed by the control module 102 as described below, with the intent to determine which changes affect operational dependencies and which do not, thereby limiting unnecessary analysis processing.

For a change in a vulnerability of a component (Case #5), which may happen frequently, security risks could be re-evaluated as disclosed in the above-referenced patent applications only if the corresponding model node is a member of a subset for an existing operational dependency. No re-evaluation of security risk for other subsets would be in order. Since vulnerabilities do not affect system or model topology, no re-computation of subsets would be necessary, and accordingly no changes would be made to the tables 60, 70 in table-based embodiments.

Suppose there is a change of vulnerability in the Router A (FIG. 3). Only the risks for operational dependencies for which model node A is a subset member, i.e., the "Server 1 Depends-on Database 1" operational dependency, should be re-evaluated by the analysis system 100. This change does not affect the security risks associated with the "Server 2 Depends-on Database 2" operational dependency, and also does not affect the actual operational dependency subsets at all. No re-computation of subsets will be performed, and no changes are made to the tables 60, 70 where those tables are provided.

A service component (Case #6) may only be "Composed-of" other service/physical assets, as described in the above-referenced U.S. patent application Ser. No. 11/366,101. Therefore, a model node for a service component will never be a part of a subset for any "Depends-on" operational dependencies. Hence, in the event of an addition or deletion of a service component or model node, no re-computation of subsets is necessary.

If a service component that is "Composed-of" the server 1 and the database 1 is added to the network modeled by the model 40 (FIG. 3), this does not affect either of the "Depends-on" operational dependencies and therefore no subset computations are performed.

Figure 7:
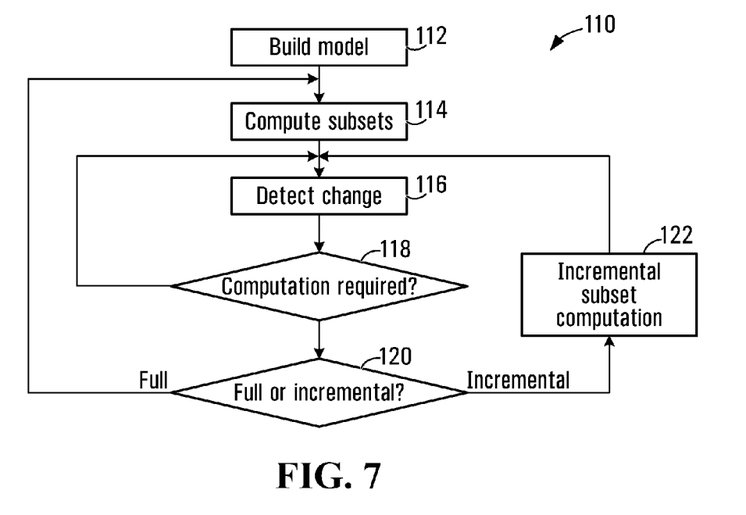
FIG. 7 is a flow diagram of a method according to an embodiment of the invention.

FIG. 7 is a flow diagram of a method according to an embodiment of the invention. The method 110 begins at 112 with the construction of a model. The model includes at least model nodes that represent components of a modeled system, operational dependencies between model nodes, and model edges that interconnect the nodes and represent relationships between the components in the modeled system.

At 114, subsets of the model nodes that can impact operational dependencies between other model nodes are computed.

When a change to the model occurs and is detected at 116, a determination is made at 118 as to whether any subset computation(s) may be required. If not, no subset computations are performed, and the method awaits a further change in the model. At 120, if a subset computation is required, a determination is then made as to whether a full subset computation or an incremental subset computation should be performed. A full subset computation is performed at 114, or an incremental subset computation is performed at 122 depending on the determination made at 120.

It should be appreciated that the method 110 is illustrative of one embodiment of the invention. Variations of the method 110 are also contemplated. For example, a parameter analysis might be performed based on the subsets computed at 114 and 122, possibly with similar control steps as at 118, 120. Further variations of the method 110 may be or become apparent to those skilled in the art. In general, methods according to other embodiments may include further, fewer, or different operations, performed in a similar or different order, than shown in FIG. 7. Examples of such operations, and various ways in which operations may be performed, will be apparent from the foregoing description of FIGS. 1 to 6 for instance.

Figure 8:
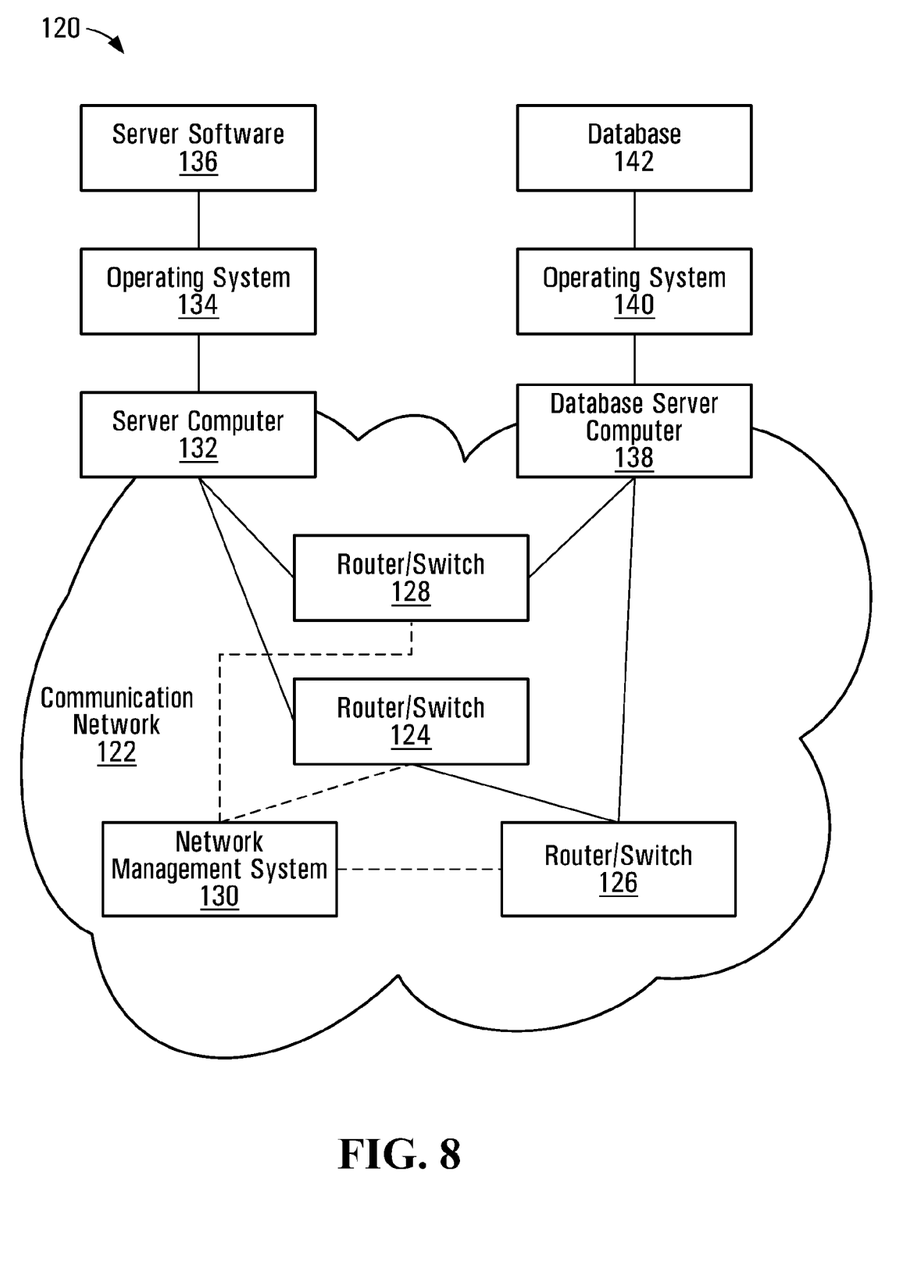
FIG. 8 is a block diagram of a communication system in conjunction with which embodiments of the invention may be implemented.

FIG. 8 is a block diagram of a communication system 120, as an example of a system in conjunction with which embodiments of the invention may be implemented. The communication network 122 includes routers/switches 124, 126, 128 through which communication links may be established, a server computer 132 and a database server computer 138 which communicate through the routers/switches, and a network management system 130 for managing the routers/switches.

The server computer 132 and the database server computer 138 are examples of the components modeled in FIG. 1. These computers, along with their operating systems 134, 140 and server and database application software 136, 142, might cooperate to provide a database access service such as an inventory service.

The types of equipment that might be implemented as the routers/switches 124, 126, 128, the server computers 132, 138, and the network management system 130, as well as other equipment that may be provided in a communication network, will be apparent to those skilled in the art. The present invention is in no way restricted to any specific types of equipment or other communication network components, or even to communication systems as noted above. Although not explicitly shown in FIG. 8, other components associated with the communication network 122, including buildings in which communication equipment or other elements are housed, may also be included in a model of the communication system 120.

Embodiments of the invention as disclosed herein would be useful in the network management system 130, for example, as part of a security risk and/or reliability analysis system. The modeling techniques disclosed herein might thus be implemented as an extension to existing network management systems or other systems. Considering a telecommunications service provider for instance, embodiments of the present invention could complement an Operation Support System (OSS) and could be integrated in a Security Operation Center (SOC) next to a Network Operation Center (NOC).

As described above, embodiments of the present invention may identify those cases where re-enumeration of MCSs between dependent model nodes of a graph-based model may not require complete re-enumeration or where re-enumeration can be avoided entirely, thereby limiting processing overhead. The use of MCSs has been identified for multiple domains, including communication systems and other types of systems. Other uses may also be or become apparent to those skilled in the art. Therefore, the techniques disclosed herein may provide a significant advantage for any real-time system, near real-time system, or any system that uses MCSs but has limited processing capacity and must allow for topology changes in the underlying graphs.

These techniques may be highly valuable in that they limit the processing required due to topology changes in a graph-based model for any system, method, or algorithm making use of cut-sets for analysis. More specifically, systems using cut-sets for the following purposes, as well as others, could take advantage of the present invention:

- system reliability calculations based on BDD for PRA, where changes to an underlying system would result in a new BDD;
- identification of critical points in a communication network for flow monitoring and/or security monitoring of traffic between source and destination endpoints, where changes in the network topology affect the graph between the source and destination endpoints;
- evaluation of network topology to identify critical failure points between source and destination endpoints, where changes in the network topology affect paths between the source and destination endpoints; and/or
- evaluation of network security vulnerabilities between source and destination endpoints, where changes in the network topology affect the paths between the source and destination endpoints.

The above and other lists presented herein should not in any way be considered exhaustive. Other change cases and applications of the present invention, for example, may be or become apparent to those skilled in the art.

What has been described is merely illustrative of the application of principles of embodiments of the invention. Other arrangements and methods can be implemented by those skilled in the art without departing from the scope of the present invention.

For example, embodiments of the invention have been described above in relation to the enumeration of cut-sets and their variants (vertex cut-sets, node cut-sets, etc.) for the purposes of network vulnerability analysis. However, the present invention can be applied to other domains where cut-sets might be found to be useful (i.e., system reliability theory, network analysis, and systems other than communication systems). More generally, embodiments of the invention may be used to solve the problem of completely re-enumerating a cut-set between known points following a topology change in a graph between source and destination end-points.

This is often a requirement for other aspects of network analysis, beyond network security analysis, and accordingly the scope of application of cut-sets, or subsets in general, for multi-node graphs applies generally across the fields of system modeling and analysis. Therefore, while some embodiments of the invention may be applied to network security analysis, it may be valuable, for example, in any field where cut-sets are applied and the topology of a graph may change over time.

It should be noted that the granularity of a model may vary between applications. As described above, a connection that includes a physical connection and communication devices such as modems may be modeled as a single connection, or the communication devices and the physical connection could be modeled separately. Different granularities of operational dependency mapping might similarly be used in different applications. In the case of a deleted model edge, for instance, the operational dependencies for which subsets are to be computed could be identified as described above on the basis of the model node endpoints of the deleted model edge. It is possible that model nodes may have different model edges through which different operational dependencies can be impacted. A model node might appear in a subset for a first operational dependency due to a first model edge, and might appear in a subset for a second operational dependency due to a second model edge. In this case, deletion of the first model edge would not necessitate re-computation of subsets for the second operational dependency. An even more selective incremental subset computation mechanism could thus be provided, for example, by providing an indication of a model edge for each subset.

Subset computations after a change to a model are selected or limited on the basis of affected operational dependencies. Other criteria could also possibly be taken into account. A user might wish to consider the effect of a particular change on only specific operational dependencies. Some embodiments might enable such user-directed subset computations based on user inputs, for instance.

MCSs are one example of a type of subset. In an interconnected graph of model nodes and model edges representing components and relationships in a network, there may be some graph topologies where MCSs will not include all model nodes on available paths between a source and destination. Thus, it might be useful in some embodiments to compute and store all subsets, not only minimal subsets such as MCSs.

In addition, although described primarily in the context of methods and systems, other implementations of the invention are also contemplated, as instructions stored on a machine-readable medium, for example.

We claim:

1. An apparatus comprising:
a computation module operable to perform subset computations for a graph-based model, the graph-based model comprising model nodes that represent components of a modeled system, operational dependencies between model nodes, and model edges that interconnect the nodes and represent relationships between the components in the modeled system, the subset computations comprising computing subsets of the model nodes that can impact operational dependencies between other model nodes, each computed subset comprising a subset of the model nodes that, if the model nodes of the subset are removed from the graph-based model, would separate other model nodes, between which there is an operational dependency, into different disconnected subgraphs of the graph-based model; and
a control module operatively coupled to the computation module and operable to determine whether, due to a change to the graph-based model that results in a changed graph-based model, a partial subset computation to compute one or more subsets for only one or more particular operational dependencies between model nodes in the changed graph-based model should be performed, and to cause the computation module to perform the partial subset computation based on the determination, the one or more particular operational dependencies comprising fewer than all operational dependencies in the changed graph-based model,
at least one of the computation module and the control module being implemented using hardware,
wherein the control module is further operable to determine whether no subset computation or a full subset computation should be performed to compute subsets for all operational dependencies between model nodes in the changed graph-based model due to the change to the graph-based model, and, based on the determination, to cause the computation module to perform the full subset computation, the partial subset computation, or no subset computation,
wherein the control module is operable to determine whether the full, the partial, or no subset computation should be performed by determining that the full subset computation is to be performed where the change comprises adding to the graph-based model a model node that is not a leaf model node or adding to the graph-based model a model edge between model nodes; determining that the partial subset computation is to be performed where the change comprises deleting from the graph-based model a model node that is not a leaf model node, adding to or deleting from the graph-based model an operational dependency between model nodes, or deleting from the graph-based model a model edge between model nodes; and determining that no subset computation is to be performed where the change comprises adding to or deleting from the graph-based model a leaf model node having no operational dependencies with other model nodes.

2. The apparatus of claim 1, wherein the control module is further operable to determine whether the partial subset computation should be performed by identifying in the graph-based model a model node that is affected by the change, and determining whether the affected model node comprises one of the computed subsets of model nodes.

3. The apparatus of claim 1, wherein the partial subset computation comprises at least one of: a subset computation to compute one or more subsets for a new operational dependency between model nodes, and a subset computation to compute one or more subsets for an existing operational dependency between model nodes.

4. The apparatus of claim 1, further comprising:
a change detector operatively coupled to the control module and operable to detect the change to the graph-based model and to provide to the control module an indication of detection of the change.

5. The apparatus of claim 1, further comprising:
a user interface operatively coupled to the control module and operable to receive inputs from a user, wherein the change comprises a change entered by a user through the user interface.

6. The apparatus of claim 1, wherein the change to the graph-based model reflects a change in the modeled system.

7. The apparatus of claim 1, further comprising:
an analysis system operatively coupled to the computation module and to the control module and operable to perform an analysis of a parameter associated with the modeled system based on the computed subsets,
wherein the control module is further operable to determine whether a full analysis of the modeled system, a partial analysis for only one or more particular operational dependencies between model nodes in the changed graph-based model, or no analysis of the modeled system should be performed due to the change, and, based on the determination, to cause the analysis system to perform the full analysis, the partial analysis, or no analysis of the modeled system.

8. The apparatus of claim 7, wherein the analysis system comprises a security risk analysis system operable to perform a security risk analysis based on the computed subsets.

9. The apparatus of claim 1, wherein each of the subsets comprises a minimal cut-set.

10. A method comprising:
a computation module performing subset computations for a graph-based model, the
graph-based model comprising model nodes that represent components of a modeled system, operational dependencies between model nodes, and model edges that interconnect the nodes and represent relationships between the components in the modeled system, the subset computations comprising computing subsets of the model nodes that can impact operational dependencies between other model nodes, each computed subset comprising a subset of the model nodes that, if the model nodes of the subset are removed from the graph-based model, would separate other model nodes, between which there is an operational dependency, into different disconnected sub-graphs of the graph-based model;
a control module, operatively coupled to the computation module, determining whether, due to a change to the graph-based model that results in a changed graph-based model, a partial subset computation to compute one or more subsets for only one or more particular operational dependencies between model nodes in the changed graph-based model should be performed; and
the computation module performing the partial subset computation based on the determination, the one or more particular operational dependencies comprising fewer than all operational dependencies in the changed graph-based model,
at least one of the computation module and the control module being implemented using hardware,
the method further comprising:
determining whether no subset computation or a full subset computation should be performed for all operational dependencies between model nodes in the changed graph-based model due to the change to the graph-based model; and
performing the full subset computation, the partial subset computation, or no subset computation, based on the determination,
wherein determining whether the partial subset computation should be performed comprises determining that the partial subset computation is to be performed where the change comprises deleting from the graph-based model a model node that is not a leaf model node, adding to or deleting from the graph-based model an operational dependency between model nodes, or deleting from the graph-based model a model edge between model nodes, and
wherein determining whether no subset computation or the full subset computation should be performed comprises determining that the full subset computation is to be performed where the change comprises adding to the graph-based model a model node that is not a leaf model node or adding to the graph-based model a model edge between model nodes, and determining that no subset computation is to be performed where the change comprises adding to or deleting from the graph-based model a leaf model node having no operational dependencies with other model nodes.

11. The method of claim 10, wherein determining whether the partial subset computation should be performed further comprises identifying in the graph-based model a model node that is affected by the change, and determining whether the affected model node comprises one of the computed subsets of model nodes.

12. The method of claim 10, wherein the partial subset computation comprises at least one of: a subset computation to compute one or more subsets for a new operational dependency between model nodes, and a subset computation to compute one or more subset for an existing operational dependency between model nodes.

13. The method of claim 10, further comprising:
performing an analysis of a parameter associated with the modeled system based on the computed subsets;
determining whether a full analysis of the modeled system, a partial analysis for only one or more particular operational dependencies between model nodes in the changed graph-based model, or no analysis of the modeled system should be performed due to the change; and
performing the full analysis, the partial analysis, or no analysis of the modeled system, based on the determination.

14. The method of claim 10, wherein each of the subsets comprises a minimal cut-set.

15. A non-transitory computer-readable medium storing instructions which when executed perform the method of claim 10.

* * * * *